United States Patent
Forbes et al.

(10) Patent No.: US 6,734,510 B2
(45) Date of Patent: May 11, 2004

(54) TECHNIQUE TO MITIGATE SHORT CHANNEL EFFECTS WITH VERTICAL GATE TRANSISTOR WITH DIFFERENT GATE MATERIALS

(75) Inventors: Leonard Forbes, Corvallis, OR (US); Luan C. Tran, Meridian, ID (US); Kie Y. Ahn, Chappaqua, NY (US)

(73) Assignee: Micron Technology, Ing., Boise, ID (US)

( * ) Notice: Subject to any disclaimer, the term of this patent is extended or adjusted under 35 U.S.C. 154(b) by 0 days.

(21) Appl. No.: 09/808,114

(22) Filed: Mar. 15, 2001

(65) Prior Publication Data

US 2002/0130378 A1 Sep. 19, 2002

(51) Int. Cl.$^7$ ............................................ H01L 29/772
(52) U.S. Cl. ..................................................... 257/407
(58) Field of Search ................. 257/330, 331, 257/336, 340, 344, 341, 407, 408, 410, 412, 401, 402, 500, 577

(56) References Cited

U.S. PATENT DOCUMENTS

| | | | |
|---|---|---|---|
| 5,356,821 A | * | 10/1994 | Naruse et al. |
| 5,886,368 A | * | 3/1999 | Forbes et al. |
| 5,895,487 A | * | 4/1999 | Boyd et al. |
| 6,097,070 A | * | 8/2000 | Mandelman et al. |
| 6,114,736 A | * | 9/2000 | Balasubramanyam et al. |
| 6,274,510 B1 | * | 8/2001 | Wilk et al. |
| 6,281,559 B1 | * | 8/2001 | Yu et al. |
| 6,348,387 B1 | * | 2/2002 | Yu |
| 6,563,151 B1 | * | 5/2003 | Shin et al. |

OTHER PUBLICATIONS

S. Tiwari, et al., "Straddle Gate Transistors: High $I_{on}/I_{off}$ Transistors at Short Gate Lenghts" IBM Research Division.

W. Long, et al., "Dual–Material Gate (DMG) Field Effect Transistor".

N. R. Rueger, et al. "Selective Etching of $SiO_2$ Over Polycrystalline Silicon Using $CHF_3$ in an Inductively Coupled Plasma Reactor".

S. Vallon, et al., "Polysilicon–germanium Gate Patterning Studies in a High Density Plasma Helicon Source", J. Vac. Sci. Technol. A 15(4), Jul./Aug. 1997.

P. Patel, et al., "Low Temperature VUV Enhanced Growth of Thin Silicon Dioxide Films" Applied Surface Science 46 (1990) 352–356.

W. Shindo, et al., "Low–Temperature Large–Grain Poly–Si Direct Deposition by Microwave Plasma Enhanced Chemical Vapor Deposition Using $SiH_4/Xe$", J. Vac. Sci. Technol. A 17(5), Sep./Oct. 1999.

(List continued on next page.)

*Primary Examiner*—Nathan J. Flynn
*Assistant Examiner*—Kevin Quinto
(74) *Attorney, Agent, or Firm*—Dickstein Shapiro Morin & Oshinsky

(57) ABSTRACT

This invention relates to a process of forming a transistor with three vertical gate electrodes and the resulting transistor. By forming such a transistor it is possible to maintain an acceptable aspect ratio as MOSFET structures are scaled down to sub-micron sizes. The transistor gate electrodes can be formed of different materials so that the workfunctions of the three electrodes can be tailored. The three electrodes are positioned over a single channel and operate as a single gate having outer and inner gate regions.

63 Claims, 10 Drawing Sheets

OTHER PUBLICATIONS

R. Nozawa, et al., "Low Temperature Polycrystalline Silicon Film Formation With and Without Charged Species in an Electron Cyclotron Resonance $SiH_4/H_2$ Plasma–Enhanced Chemical Vapor Deposition", J. Vac. Sci. Technol. A 17(5), Sep./Oct. 1999.

C. Saha, et al., "Ion Assisted Growth and Characterization of Polycrystalline Silicon and Silicon–Germanium Films" (visited Nov. 18, 1999). <http://www.dialogselect.com/tech/cgi/pres>.

D. Landheer, et al., "Formation of High–Quality Silicon Dioxide Films by Electron Cyclotron Resonance Plasma Oxidation and Plasma–Enhanced Chemical Vapour Deposition" (visited Oct. 21, 1999) <http://www.dialogselect.com/tech/cgi/pres>.

K. Usami, et al., "Thin Si Oxide Films for MIS Tunnel Emitter by Hollow Cathode Enhanced Plasma Oxidation" (visited Oct. 21, 1999) <http://www.dialogselect.com/tech/cgi/pres>.

K.C. Saraswat, et al. "A Low Temperature Polycrystalline SiGe CMOS TFT Technology for Large Area AMLCD Drivers" (visited Nov. 18, 1999) <http://www.dialogselect.com/tech/cgi/pres>.

* cited by examiner

ASPECT RATIO EQUATION $$r = \frac{3L}{(W_d \cdot t_{ox} \cdot X_j)}$$

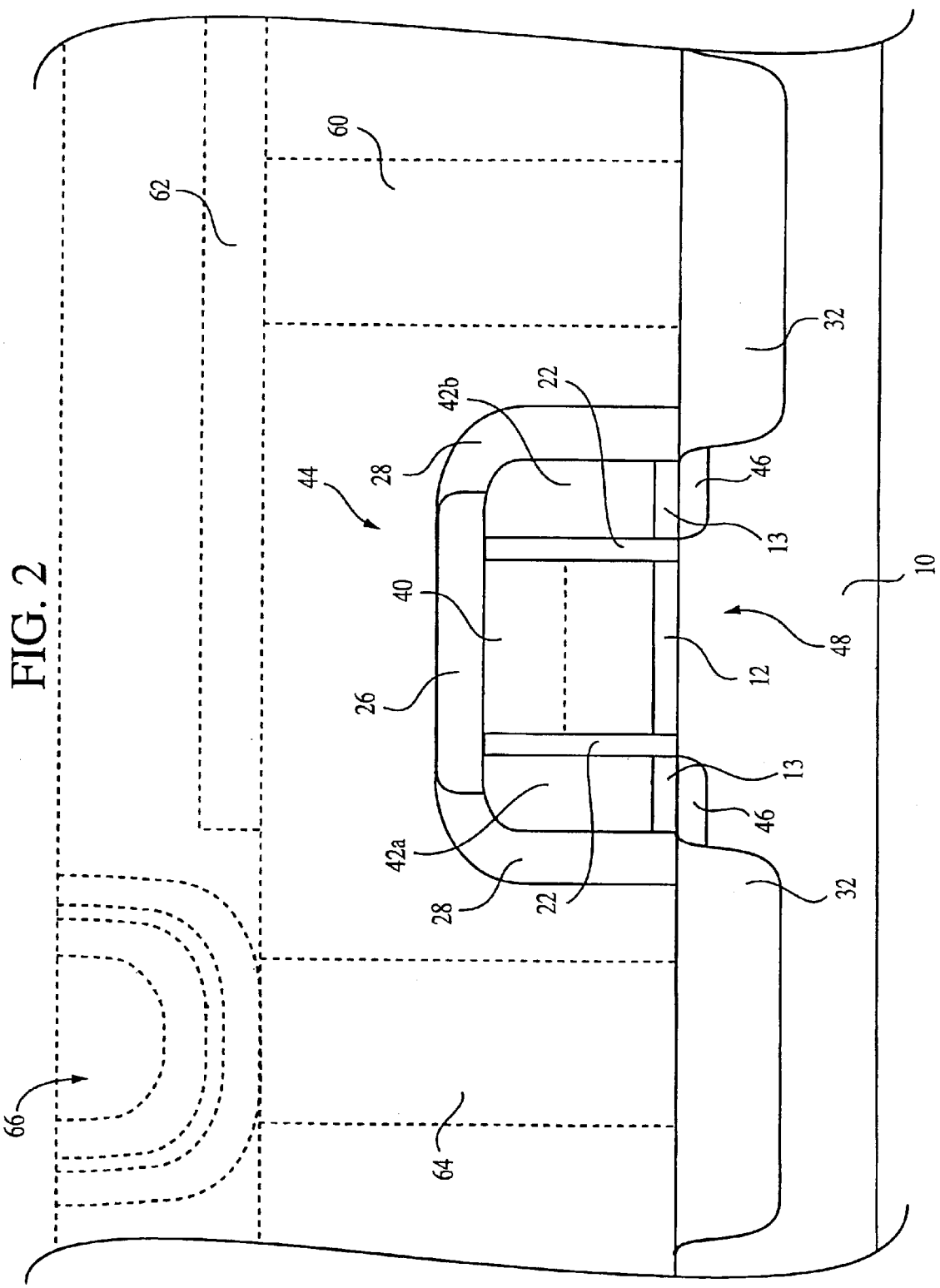

LOW $V_t$ REGION

HIGH $V_t$ REGION

P+ DOPED POLYCRYSTALLINE Si/Ge GATE

N+ DOPED SILICON CARBIDE COMPOUND ($Si_{1-x}C_x$) OR SILICON OXYCARBIDE

# TECHNIQUE TO MITIGATE SHORT CHANNEL EFFECTS WITH VERTICAL GATE TRANSISTOR WITH DIFFERENT GATE MATERIALS

FIELD OF THE INVENTION

This invention relates to the field of semiconductor transistors that are scaled down to sub-micron sizes.

BACKGROUND OF THE INVENTION

There is ever-present pressure in the semiconductor industry to develop smaller and more highly integrated devices. As the industry standard approaches smaller and smaller scaled devices, problems with further advancement are presented and it becomes more difficult to produce sub-micron devices that can perform as desired.

As MOSFET are scaled to deep sub-micron dimensions it becomes increasingly difficult to maintain an acceptable aspect ratio, as shown in FIG. 1a. FIG. 1a shows a representational illustration of a MOSFET having a polysilicon gate 3 over a substrate 5, with the two being separated by a gate oxide 7. Source and drain regions 9 of the substrate are on either side of the gate structure, forming a transistor. The aspect ratio equation represents the spatial relationship between the elementary parts of a MOSFET device, specifically between the distance between the source/drain areas defining the effective gate length (L), the width of the depletion region ($W_d$), the depths of the source/drain areas ($x_j$), and the gate oxide thickness ($t_{ox}$). Detrimental short-channel effects occur when the gate length (L) is reduced by the same order as the width of the depletion region ($W_d$). In current trends, not only are the gate oxide thicknesses scaled to under 5 nm (50 Å) dimensions as the channel lengths are shortened to sub-micron sizes, but also, the depletion widths (synonymous with $W_d$) and source/drain junction depths ($x_j$) must be scaled to smaller dimensions as well. The depletion region width (or space charge) ($W_d$) are made smaller by increasing the substrate or channel dopings. However, it is extremely difficult to scale junction depths to under 100 nm dimensions because these are doped by ion implantation and thermally activated.

Related to aspect ratio are short channel effects, which are highly dependent on the channel length. For shorter channel devices (channel lengths below 2 μm) a series of effects arise that result in deviations from the predictable performance of larger scaled devices. Short channel effects impact threshold voltage, subthreshold currents, and I-V behavior beyond threshold. Techniques have been developed for avoiding short channel effects in MOSFETs, such as the "straddle gate" transistor shown in FIG. 1b. Such a structure utilizes thinner gate oxides 11 under the gate sidewall spacers 21 to allow the regions to turn-on easier and at lower voltages. A thicker gate oxide 15 is provided beneath the gate 17. These thinner regions produce a "virtual" source/drain junction 19 with minimal junction depth. The problem with such structures is that gate oxides are already approaching theoretical minimal values, therefore, regions of even thinner gate oxides pose reliability risks. It would be beneficial to devise a semiconductor having an acceptable aspect ratio, where the channel length is large enough when the device is "off" to avoid short channel effects and undesired shorting of the device, and where the device channel is short enough when the device is "on" to allow for the fastest operation possible.

SUMMARY OF THE INVENTION

This invention relates to a process of forming a transistor having three adjacent gate electrodes and the resulting transistor. In forming such a transistor it is possible to mitigate short channel effects as MOSFET structures are scaled down to sub-micron sizes. This transistor fabrication process can utilize different materials for the gate electrodes so that the workfunctions of the three gate electrodes can be tailored to be different. The three gate electrodes can be connected by a single conducting line and all three are positioned over a single channel and operate as a single gate having a pair of outer gate regions and an inner gate region. This allows for use with higher source and drain voltages. These devices provide for higher performance, using a standard or scaled down transistor surface area, than can be achieved with conventional transistor structure. They have smaller effective channel lengths when "on," and consequently, faster speeds are achievable. The devices have longer channel lengths when "off," thereby mitigating short channel effects.

In an alternative arrangement the two side gate electrodes can be independently biased to a fixed voltage to turn on portions of the channel regions over source/drain extensions and the inner gate can subsequently turn on a portion of the channel region between the source/drain regions.

These and other features and advantages of the invention will be more clearly understood from the following detailed description of the invention which is provided in connection with the accompanying drawings.

BRIEF DESCRIPTION OF THE DRAWINGS

FIG. 2 is an illustration of a semiconductor device transistor in accordance with the invention;

DETAILED DESCRIPTION OF THE PREFERRED EMBODIMENTS

Figure 1A:
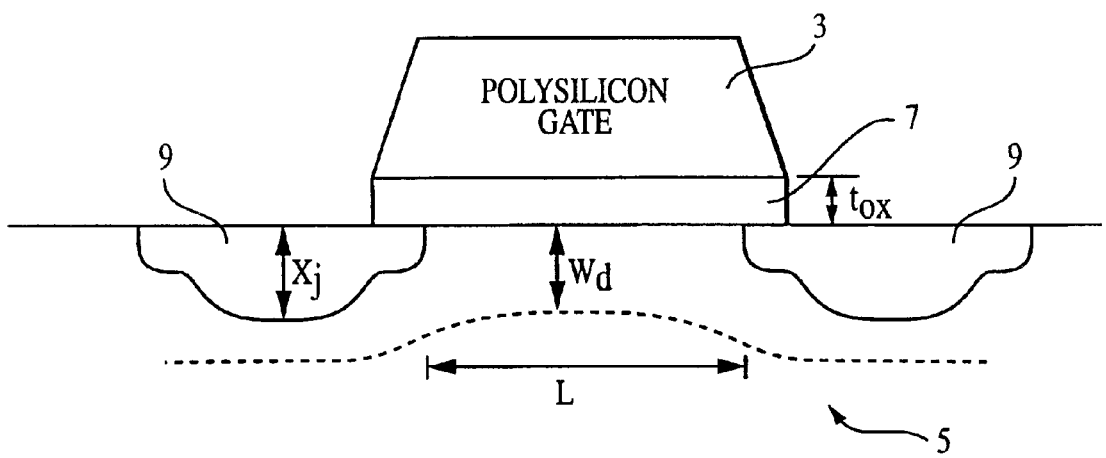
FIG. 1a is an illustration of a typical semiconductor transistor and the relationship of its dimensions to the aspect ratio equation.
Figure 1B:
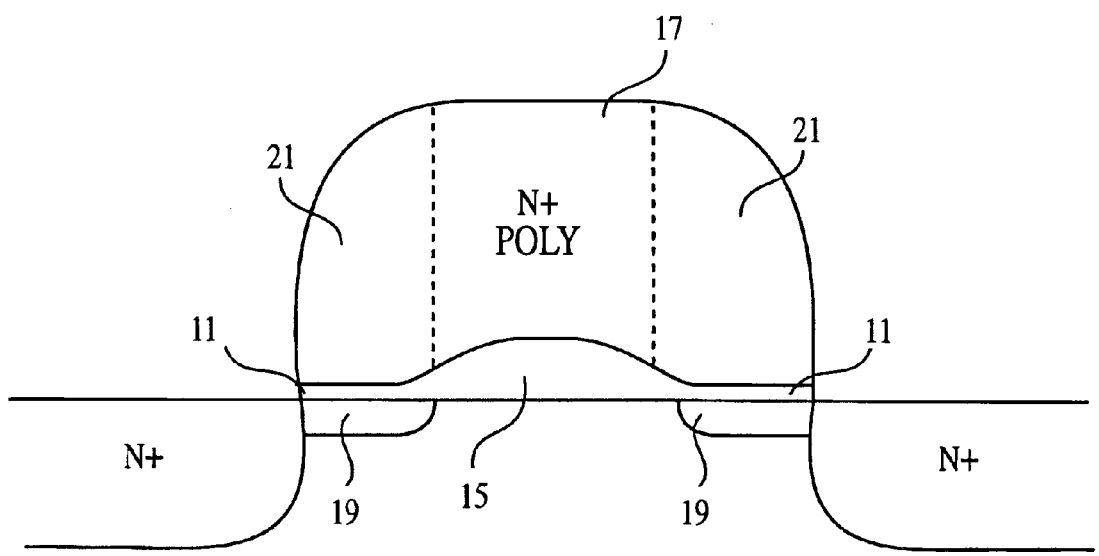
FIG. 1b is an illustration of a "straddle gate" transistor.

In the following detailed description, reference is made to various specific embodiments of the invention. These embodiments are described with sufficient detail to enable those skilled in the art to practice the invention, and it is to be understood that other embodiments may be employed, and that structural and electrical changes may be made without departing from the spirit or scope of the present invention.

In the following discussion the terms "wafer" and "substrate" are used interchangeably and are to be understood to refer to any type of semiconductor substrate, including silicon, silicon-on-insulator (SOI), and silicon-on-sapphire (SOS) technology, and other semiconductor structures. Furthermore, references to a "wafer" or "substrate" in the following description, do not exclude previous processing steps utilized to form regions or junctions in or on the base semiconductor structure or foundation.

No particular order is required for the method steps described below, with the exception of those logically requiring the results of prior steps. Accordingly, while many of the steps discussed below are discussed as being performed in an exemplary order, this order may be altered.

This invention relates to a process of forming a transistor with three adjacent gate electrodes and the resulting transistor. The transistor mitigates short channel effects as MOSFET structures are scaled down to sub-micron sizes and increases the performance of these devices. The transistor can be fabricated with different gate materials so that the workfunctions of the three gate electrodes can be tailored, thereby improving device behavior when "on" and "off." The three gate electrodes can be connected by a single conducing line and all three gate electrodes are provided over a single channel and operate as a single gate having a pair of outer gate regions and an inner gate region. Alternatively, the two side gate electrodes can be independently biased to a fixed voltage to turn on portions of the channel adjacent the source/drain regions, creating extensions, and the inner gate electrode can be turned on for the remainder of the channel by an independent voltage driving source. In such a configuration, the series resistance of the source/drain extensions can be adjusted for by controlling the inner or outer gate voltages.

Referring now to the drawings, where like elements are designated by like reference numerals, a transistor structure formed in accordance with the invention is shown in FIG. 2. For exemplary purposes, the transistor is shown as part of a DRAM memory cell having a bit line 62 and bit line plug 60, and a capacitor plug 64 and a capacitor 66, shown in dashed lines. However, the transistor is not limited to such a use and may be used for other memories (e.g., SRAM, Flash, etc.), general logic, processor, and ASIC applications. The transistor includes a gate dielectric 12 and 13 over a substrate 10, and three thin vertical gate structures 40, 42a and 42b. The outer two gate structures 42a and 42b are of one conductive type material, preferably N+ type polysilicon; and the center gate structure 40 is a different conductive type material, preferably P+ type polysilicon. All three gate electrodes can be doped by implant using As or P ions for the N+ conductivity type polysilicon and $BF_2$ or B for the P+ type polysilicon. If the gate materials are deposited at different steps, then in-situ doped polysilicon can be used, using $PH_3$ for N+, or Diborane for P+ polysilicon. Alternatively, the gate electrode arrangement may be just the opposite where the channel is to be a p-channel and the device is fabricated over an N-well. In such a scenario, gate electrode 40 is N+ polysilicon and the outer gate electrodes 42a and 42b are P+ polysilicon. Additionally, instead of using only doped polysilicon for the gate electrodes 40, 42a and 42b, it is possible to use a metal gate electrode (e.g., W, TiN, TaN, or Mo) where the middle gate 40 will have a higher workfunction than the outer gate electrodes 42a and 42b.

In the first arrangement, the N+ gate electrodes 42a and 42b are separated by a thin dielectric layer 22 from the P+ gate electrode 40, and the tops of all three gate electrodes 40, 42a, and 42b are connected by a single conductive cap 26, which is preferably doped polysilicon, but can alternatively be self-aligned silicide, $TiSi_2$, or $CoSi_2$. This device is effectively the same size (or smaller) and overall shape as a standard DRAM type transistor gate and may be utilized in virtually any semiconductor transistor device.

The inner 40 and outer 42a, 42b gate electrodes can be formed to have different workfunctions (by choice of different conductivity types and/or material types) so that upon turning on, source/drain 32 extensions 46, which consist of virtual source/drain junctions with minimal junction depth, are created by inversion of the transistor channel region below the outer gate structures 42a and 42b, thereby shortening the effective channel length of the device and allowing for faster operation. These virtual source/drain junctions 46 are not present when the device is not operating, so the actual channel length is long enough to avoid undesirable short channel effects.

There can be over a one-volt difference in the workfunction between the gate electrodes of different types. The threshold voltage ($V_t$) equation has four terms, the Fermi potential ($2\phi_f$), the bulk charge ($Q_B$), the oxide charge ($Q_{ox}$), and the workfunction difference ($\phi_{ms}$) The equation for $V_t$ can be written as follows:

$$V_t = +|2\phi_f| + |Q_B/C_{ox}| - |Q_{ox}/C_{ox}| + \phi_{ms}$$

The Fermi potential is dependent on channel doping and increases with increased doping. The bulk charge behaves the same way, but in a square root relationship. $C_{ox}$ is the normalized gate dielectric capacitance and increases as the gate dielectric thickness is reduced. The oxide charge is a function of gate dielectric processing and includes a fixed and interface charge. The workfunction difference is dependent on the gate material and is weakly dependent on the Fermi level of the substrate.

The potential (workfunction) in the gate material is a characteristic property of the material itself. In reference to FIGS. 3a and 3b, the use of different materials for the three transistor gate electrodes 40, 42a, and 42b such as those materials described herein, can tailor the transistor's $V_t$ under the different vertical gate electrodes 40, 42a, and 42b by utilizing the inherent workfunctions of those differing materials. This allows the short channel effects to be mitigated by enabling the virtual source/drain 32 extensions 46 (junctions) to be created only when transistor is "on," thereby shortening the transistor's effective channel lengths resulting in faster device performance characteristics. However, as stated, when "off," the device channel length can be large enough to avoid short channel effects. FIG. 3b relates to the channel 48 region under the central gate 40 of the FIG. 2 transistor. It illustrates the workfunction difference of the P+ poly gate 40 compared to a P-type substrate 10, where $E_f$ is the Fermi level energy (inside band gap), $E_v$ is the valence band energy, and $E_c$ is the conduction energy. The P+ poly gate 40 results in a more positive workfunction relative to the substrate and thus a higher relative $V_t$. As illustrated by FIG. 3a, which relates to the source/drain 32 extensions 46 under the outer gate electrodes 42a and 42b of the FIG. 2 transistor, the N+ poly results in a more negative workfunction relative to the substrate, and thus, a lower relative $V_t$.

In accordance with the invention, changing the gate materials of the various gate electrodes 40, 42a, and 42b will change the band gap energy. This results in differences in the workfunctions between the outer 42a, 42b and center 40 gate electrodes, and as a consequence different threshold voltages. It is the tailoring of the three gate electrodes' 40, 42a, and 42b threshold voltages that allows for the forming of the virtual source/drain 32 extensions 46. The N+ gate electrodes 42a and 42b have a more negative workfunction and have low $V_t$, and therefore, tend to be inverted or conduct at near zero gate bias and need no $V_t$ adjustments by ion implantation; they can turn on as soon as appropriate gate potential is applied. The P+ gate 40 has a more positive workfunction, resulting in a $V_t$ that can be one volt or more positive and require more voltage to turn on than the N+ gate electrodes 42a and 42b, thus they will turn on after the N+ outer gate electrodes 42a and 42b. This results in the ability to fabricate faster, scaled down devices because of such devices' ability to avoid the short channel effects that would normally occur due to the reduced channel 48 length while still having a shortened effective channel length. The outer N+ gate electrodes 42a and 42b should each occupy no more than about 10 to 33% of the total channel 48 length, preferably no more than 25% each. As illustrated in FIG. 3b, almost any workfunction difference may be obtained by using a wide band gap gate material, with low electron affinity and doping the gate material to be P type or N type.

The FIG. 2 transistor 44 works as follows. As gate voltage is applied to the conductive cap 26 and thus to the three vertical gate electrodes 40, 42a and 42b, the channel 48 regions under the N+ polysilicon gate electrodes 42a and 42b will become inverted and these outer gate electrodes will turn on first. By the time a sufficient threshold voltage for the N+ gate electrodes 42a and 42b (effectively any applied voltage) is applied, there will be conductive regions under the N+ gate electrodes, which act as "virtual" S/D (source/drain) extensions 46 (of the actually formed source and drain to which they are adjacent) with minimal junction depth. When enough voltage is applied the P+ gate 40 will start to turn on and normal transistor action will follow. The conductivity under the transistor 44 (channel 48 region) can be the same throughout. The $V_t$ of the P+ gate 40 can be around 0.3 volts, which is appropriate for deep sub-micron dimensioned devices.

Figure 2A:
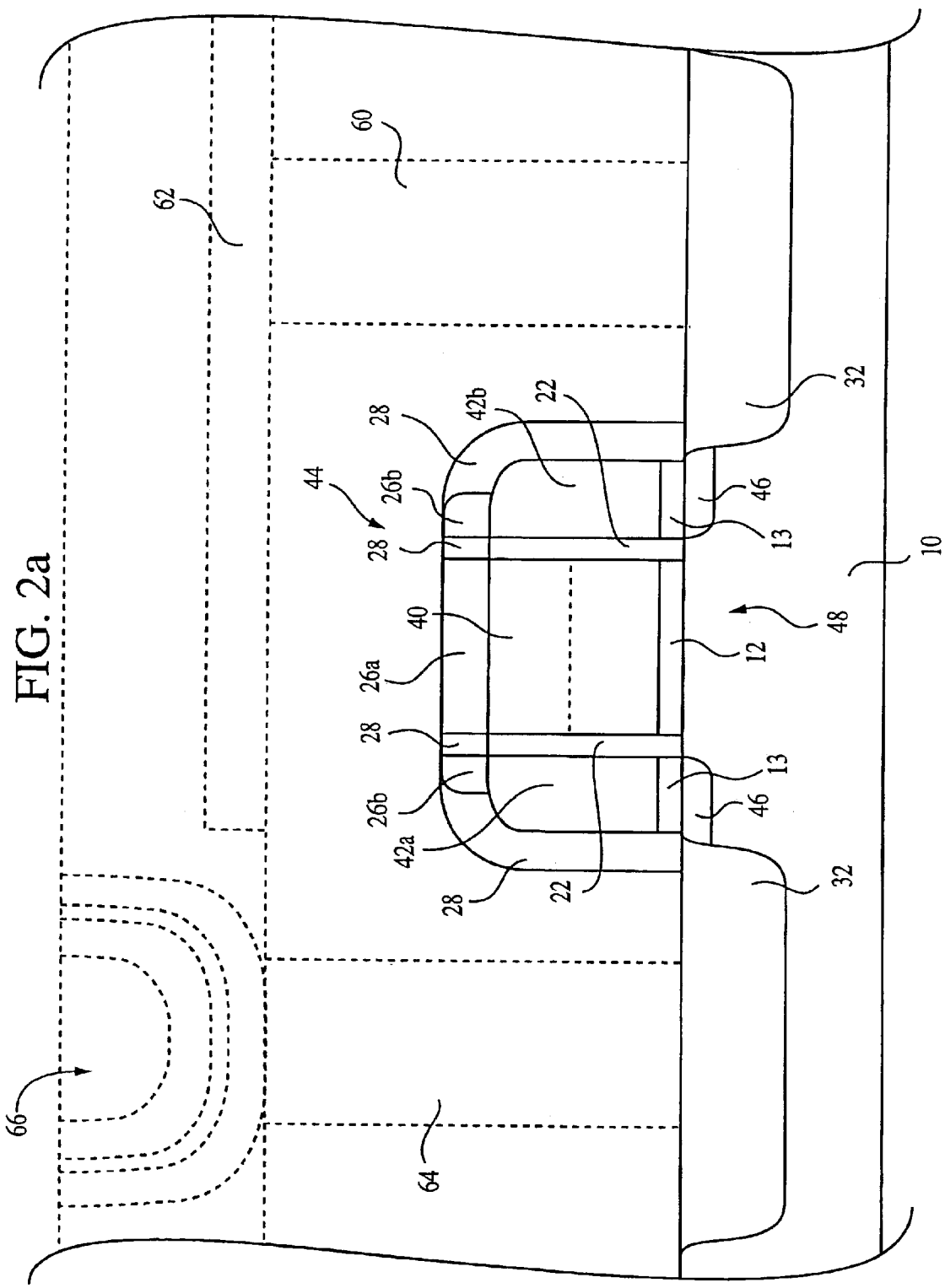
FIG. 2a is an illustration of an alternative embodiment of the semiconductor device of FIG. 2.
Figure 3A:
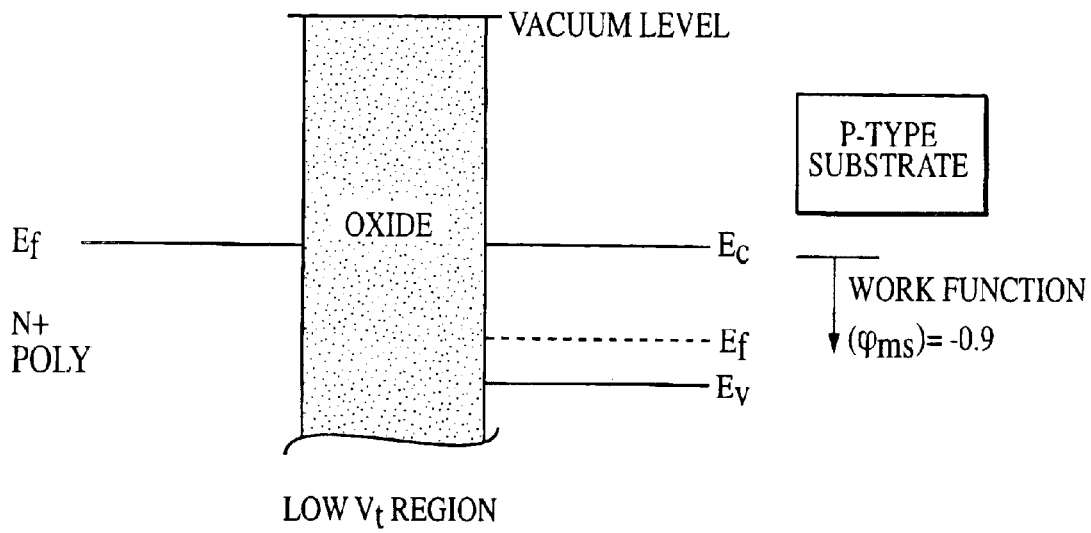
FIGS. 3a and 3b illustrate the principles of workfunction as it relates to the different areas of a semiconductor device having low and high $V_t$ in accordance with the invention.
Figure 3B:
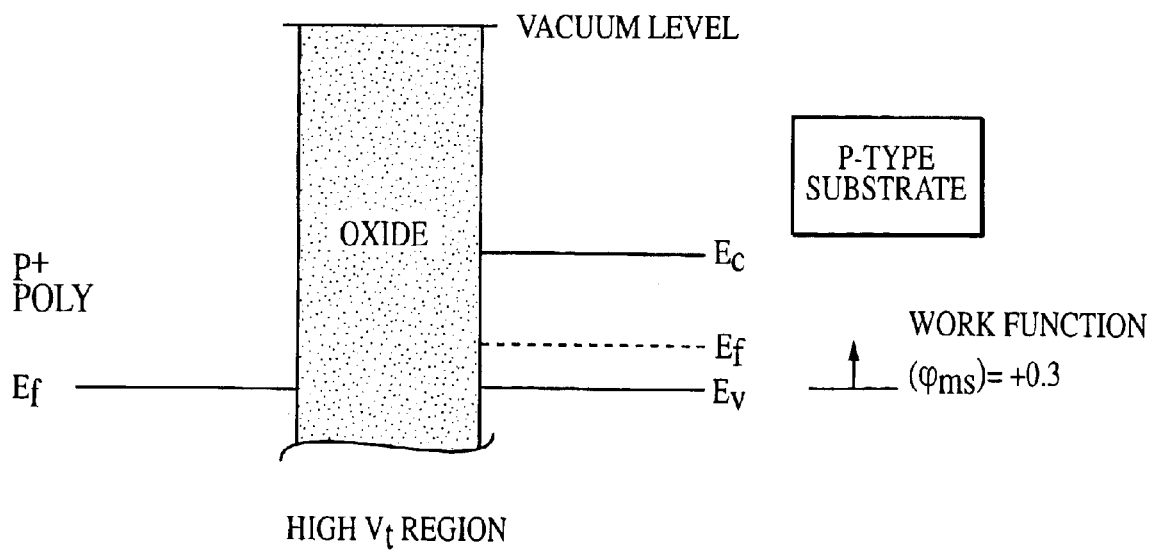

As illustrated in FIG. 2a, as an alternative embodiment, the central gate electrode 40 and the outer two gate electrodes 42a and 42b can be independently biased. The overlying polysilicon cap 26 from FIG. 2, can alternatively be formed as one conductive cap 26a in electrical contact with the central gate electrode 40 and a conductive ring cap 26b in contact with the outer two gate electrodes 42b. In this way, separate and tailored voltages can be applied independently to the three adjacent gate electrodes 40, 42a, and 42b, further tailoring the device. These separate conductive caps 26a and 26b are electrically insulated from one another. Alternatively, the outer gate electrodes 42a and 42b can be connected to a sidewall electrical contact (not shown) instead of the conductive ring cap 26b.

Figure 4:
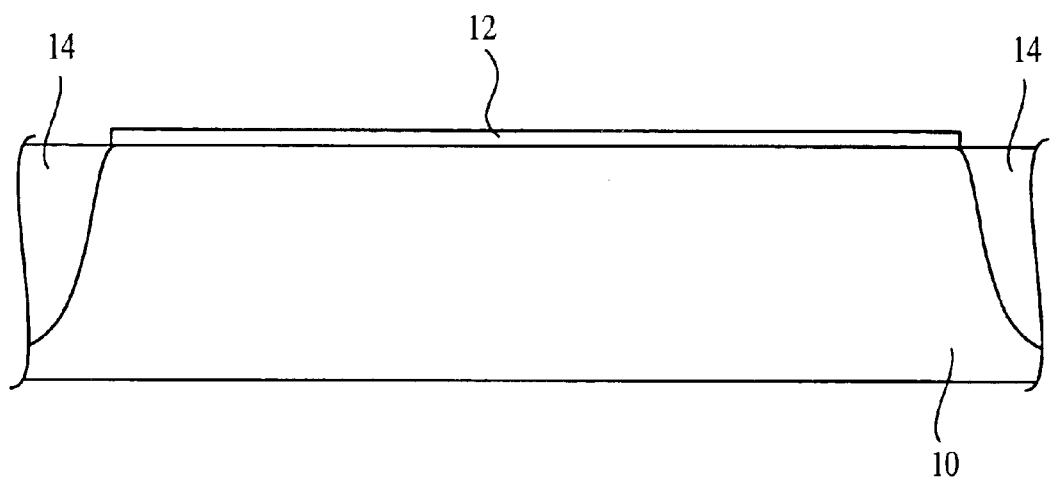
FIGS. 4–9 show a cross section of a semiconductor device during successive steps of processing in accordance with the invention.

As illustrated in FIG. 4 to FIG. 9, the transistor 44 can be formed as follows. Referring to FIG. 4, a semiconductor substrate 10 is provided. A sheet ion implantation and $V_t$ adjustment is performed on substrate 10. LOCOS or STI (Shallow Trench Isolation) can be performed to form FOX (Field Oxide) regions 14 to isolate the devices and a sacrificial oxide can be grown over the substrate to correct defects caused by the STI. If a sacrificial oxide is grown, it is removed prior to further processing.

Next, referring to FIG. 4, after a wafer surface cleaning by a standard RCA clean, a thin gate dielectric 12 is grown over the substrate 10, by, for example, thermal oxidation. Thermal nitridation, which produces a self limited silicon nitride barrier of up to about 20 Å or 2.0 nm, can be used to harden the gate dielectric 12 when a P+ center gate electrode 40 is utilized. RTP (Rapid Thermal Nitridation) in $NH_3$ or Remote Plasma Nitridation (RPN) is sufficient for this purpose. The nitridation will produce a good diffusion barrier for the gate dielectric 12, which can prevent Boron penetration from P+ doped polysilicon (or amorphous silicon). The gate dielectric 12 should be as thin as possible (e.g., 1.0–3.0 nm) to still maintain standard device functioning, as is known in the art.

Figure 5:
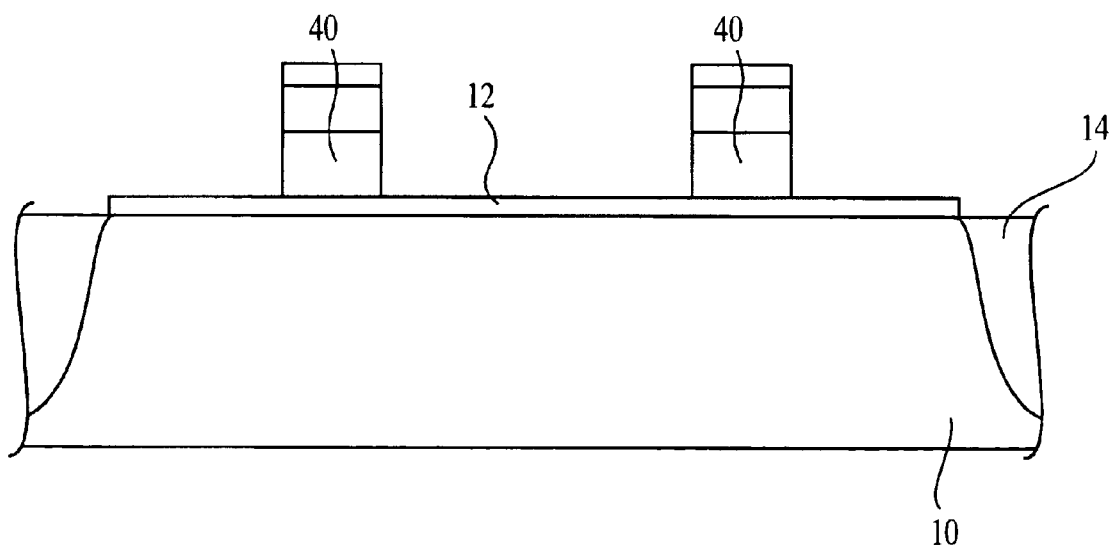

Next, referring to FIG. 5, a P+ doped polysilicon layer is formed over the wafer and the gate dielectric 12. This layer can alternatively be amorphous silicon. Over the P+ polysilicon layer is deposited a layer of conductive material, such as Tungsten (W), and a protective cap. These layers (polysilicon, conductive material and protective cap) are patterned and etched using the gate dielectric as a stop to form gate stacks as is known in the art using standard techniques. The dimensions of minimum feature size can be made subnominal by the use of etch bias or OPC (Optical Proximity Correction). Therefore, if the minimum resolution of photo-definition is 130 nm, the etch bias can make the final line width 90 to 100 nm (standard practice in the art). Subnominal gate size is needed to accommodate the additional two gate electrodes for the transistors. These gate stacks will form two center P+ gate electrodes 40 of two transistors.

Figure 6:
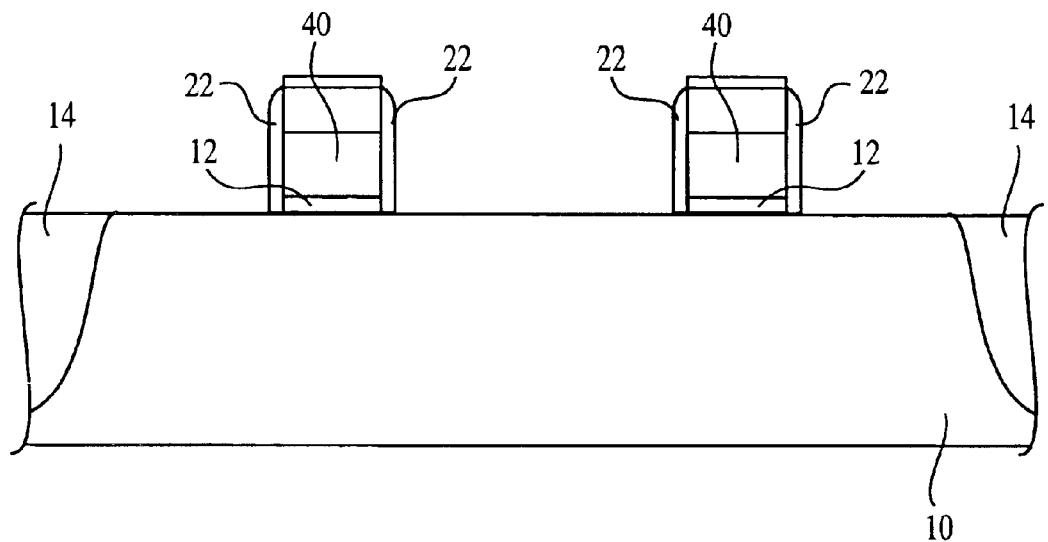

Referring to FIG. 6, a simple wet clean removes the residual gate dielectric 12. Then, a dielectric layer 22 is formed on the sides of the remaining P+ gate electrode 40 stacks by depositing a nitride layer up to, but preferably less than, about 2.0 nm in thickness. The dielectric layer 22 can alternatively be oxynitride or nitrided oxide. The dielectric layer 22 should be as thin as possible to still ensure proper insulation between the gate electrodes 40 and 42a and 42b because of the possible formation of resistive regions. Resistive regions under the transistor gate will result in a channel region of lower conductivity and thus lower device performance. A light anisotropic nitride etch is used to clear the dielectric layer 22 from over the active areas, but keeps the dielectric layer 22 on the sidewalls of the central P+ gate electrode 40.

Figure 7:
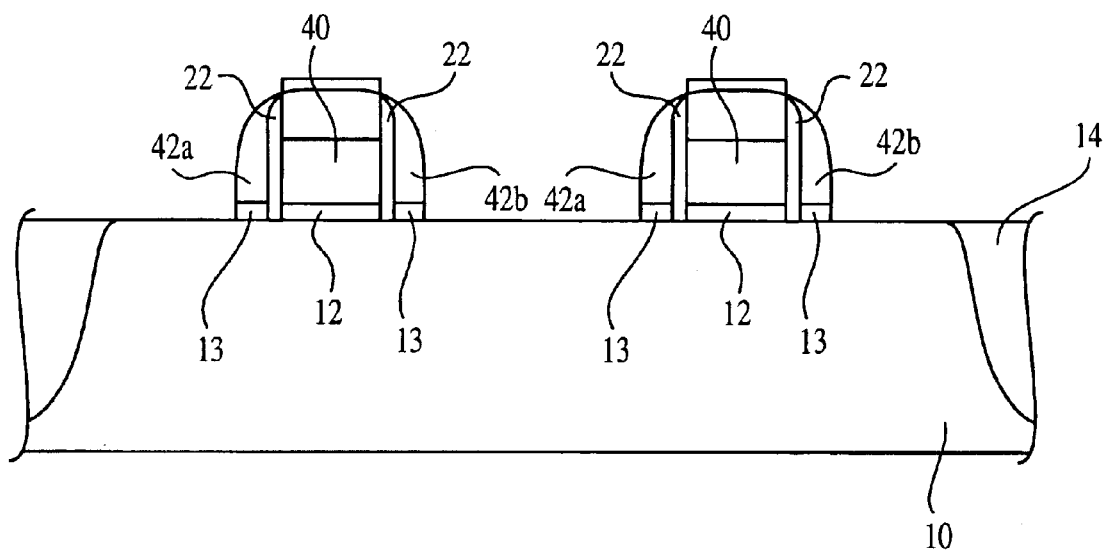

Referring to FIG. 7, the wafer is wet cleaned and prepared for the growth of a second gate dielectric 13. The second gate dielectric 13 is now grown over the substrate to a thickness substantially equal to or thinner than that of the original gate dielectric 12, which is still beneath the P+ polysilicon of the P+ gate electrode 40. This regrown gate dielectric 13 serves as the barrier between the outer gate electrodes 42a and 42b and the substrate 10.

Next, another polysilicon layer, having an N+ conductivity type, is deposited over the dielectric layer 22 and the newly formed gate dielectric 13. This will eventually form the two outer N+ gate electrodes 42a, 42b for the transistors. This N+ polysilicon is layer can be up to about 50 nm thick, preferably 20 to 25 nm thick, and can be deposited in a similar manner as the first P+ polysilicon layer. The structure is subjected to anisotropic etching to remove a portion of N+ polysilicon layer and leave sidewalls on the dielectric layer 22. The N+ polysilicon layer is thus removed from over the substrate 10 except for the portion that remains on the sides of the dielectric layer 22 adjacent to the P+ gate electrode 40. The resulting structure shown in FIG. 7 consists of two free-standing structures having three gate electrodes 40, 42a and 42b.

Figure 8:
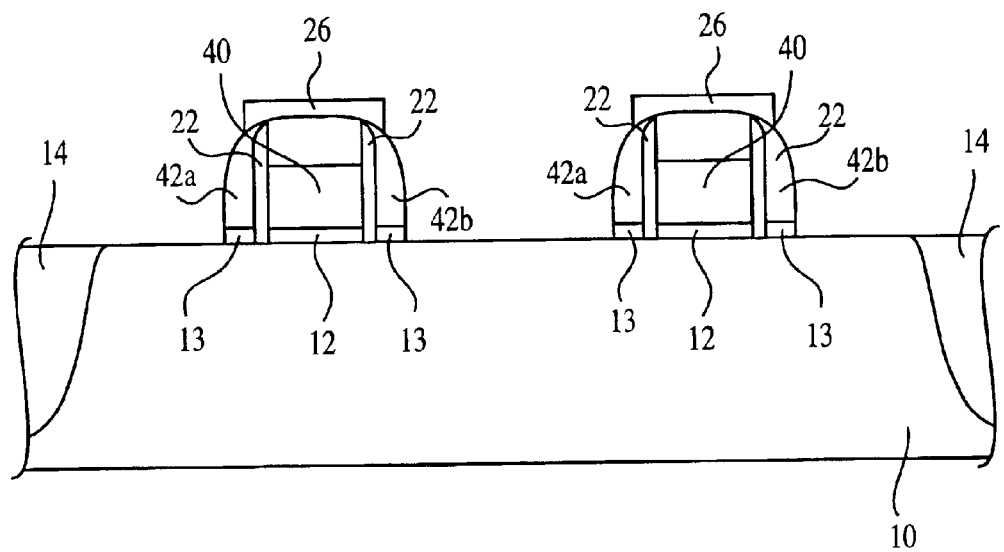

Next, referring to FIG. 8, a conductive layer, preferably polysilicon, is deposited over each of the two three-gate structures (100 nm), followed by the masking and etching of this layer to leave a conductive cap 26 (e.g., a strap contact) in electrical contact with all three gate electrodes 40, 42a and 42b of each structure. Alternatively, salicide formation of cap 26 can be used to save a masking step.

If forming the alternative embodiment illustrated in FIG. 2a, the conductive cap 26 described in reference to FIG. 8 can be patterned and etched to isolate separate conductive caps 26a and 26b over the three adjacent gate electrodes 40, 42a, and 42b. Alternatively, the outer gate electrodes 42a and 42b can be connected by a sidewall electrical contact (not shown).

Figure 9:
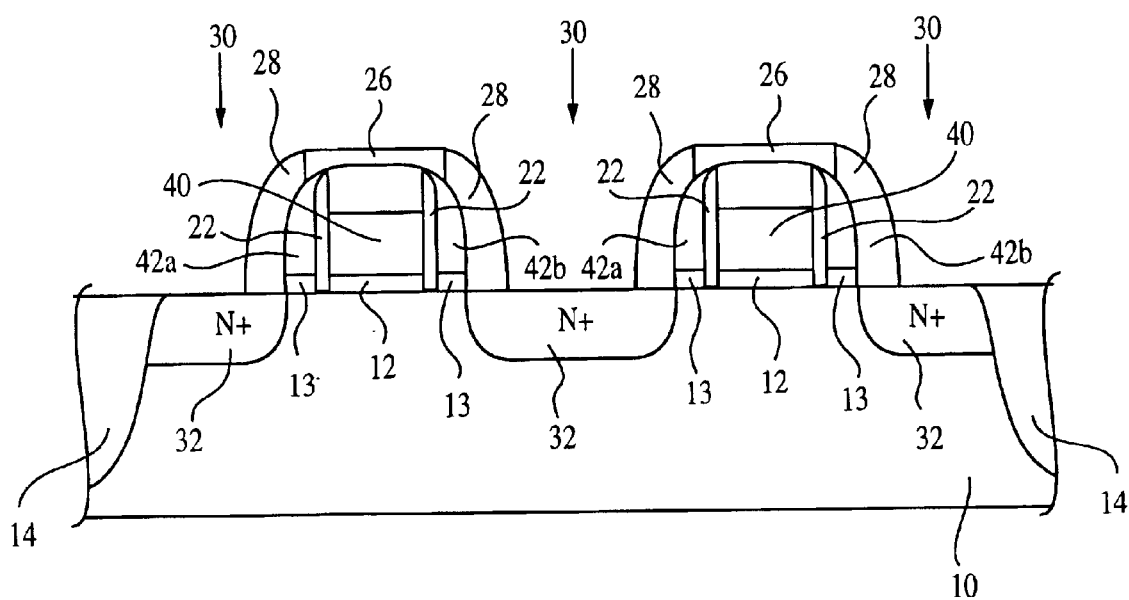

Next, referring to FIG. 9, an insulating layer, preferably oxide or nitride, is formed over the structures (10–20 nm) and dry etched to form insulating sidewall spacers 28. Then source/drain regions 32 are formed by ion implantation 30. If the alternative embodiment illustrated in FIG. 2a is to be formed, the insulating layer should be formed between the separate conductive caps 26a and 26b to electrically isolate them from one another. At this point the device according to the invention is substantially complete, only to be followed by standard semiconductor processing, including the possible formation of capacitors and interconnect lines, or other devices as appropriate for the intended transistor function, be it as part of a DRAM memory cell, or otherwise.

Figure 10A:
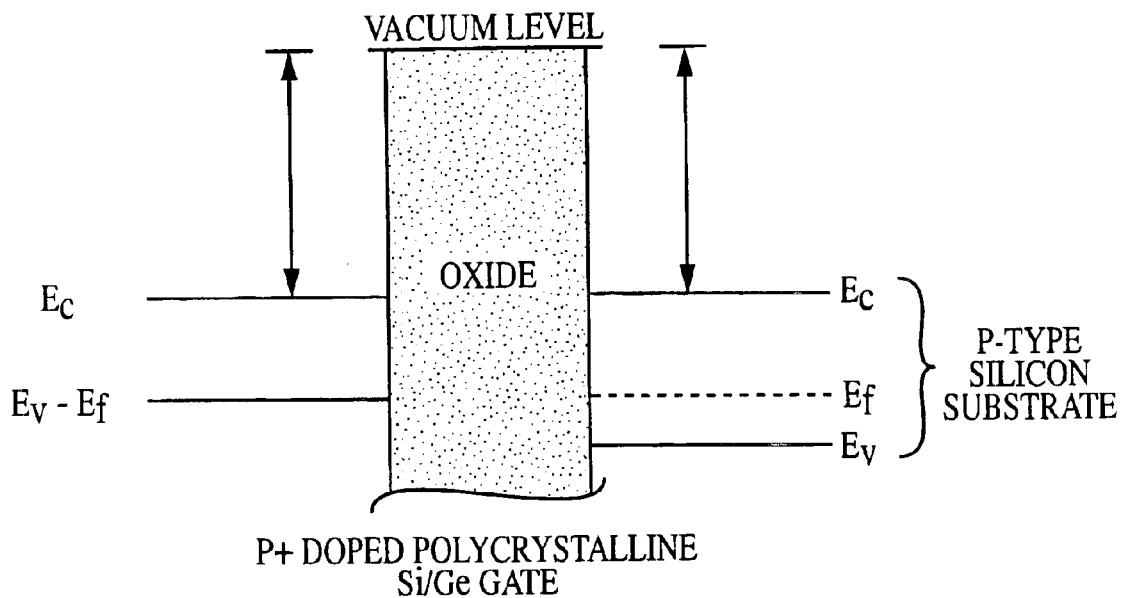
FIGS. 10a and 10b illustrate the principles of workfunction as it relates to the different materials of the semiconductor device in accordance with the invention.
Figure 10B:
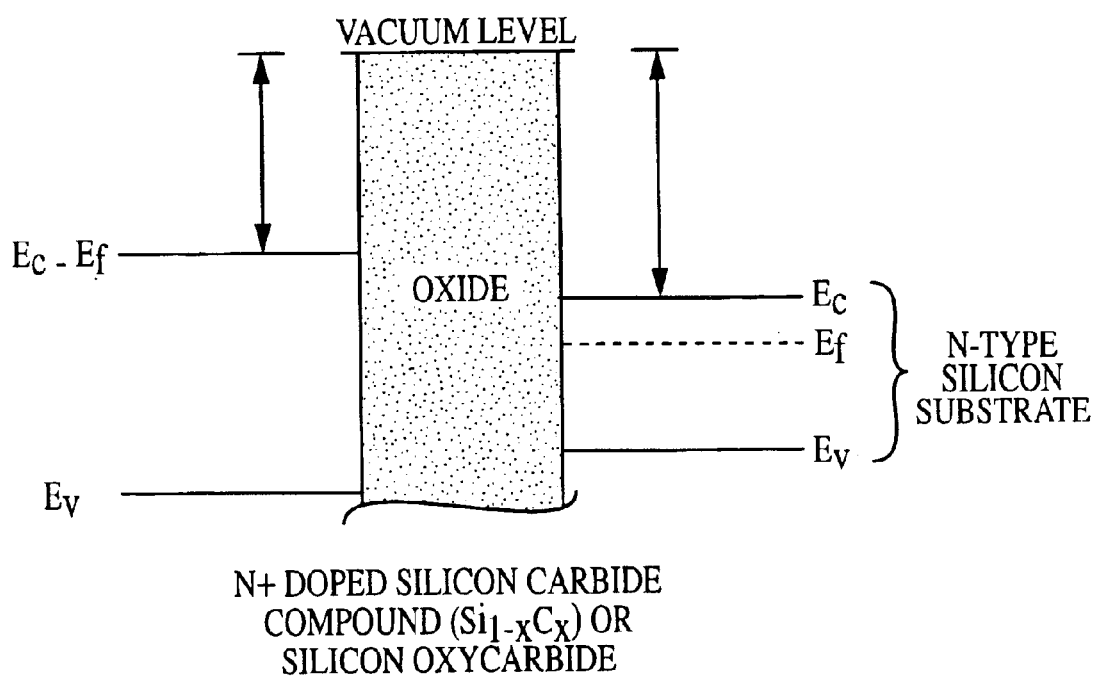

For alternative embodiments, various other materials may be used for the gate electrodes other than polysilicon. Referring to FIG. 10a, silicon-germanium may be used to tailor the workfunctions of the gate electrodes. This may be appropriate if the difference in $V_t$ between the P+ polysilicon and N+ polysilicon is excessive in relation to the power supply to the device. For low voltage applications, even a few hundred mV can be excessive. For memory access device applications, for instance, plus or minus 200 mV can cause the device to fail a margins test. A Si/Ge gate can allow adjustment of the workfunction up to 0.46 volts for 100% Ge. The Si/Ge material can be used to replace the P+ polysilicon. Referring to FIG. 10b, silicon carbide or silicon oxycarbide can also be used, for either gate types with either P-type or N-type dopings. These compounds have larger band gap energies and as a consequence, lower electron affinities and different workfunctions in comparison to silicon. Various other crystalline structures with very small grain size and quantum confinement will also produce different workfunctions and may be utilized as is known in the art.

Figure 11:
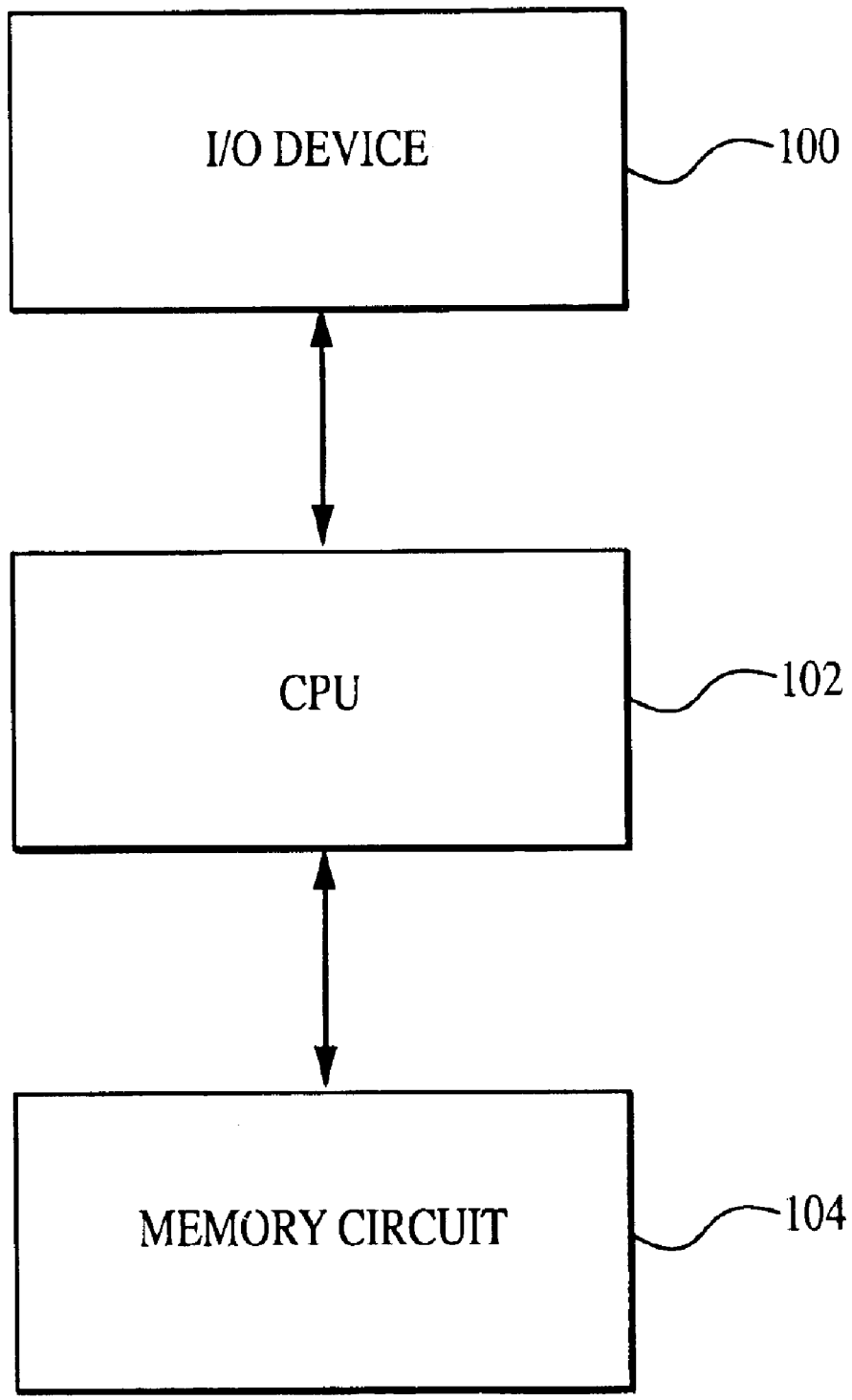
FIG. 11 is an illustration of a processor system utilizing a semiconductor device in accordance with the invention.

FIG. 11 illustrates a processor-based system (e.g., a computer system), with which semiconductor transistors constructed as described above may be used. The processor-based system comprises a central processing unit (CPU) 102, a memory circuit 104, and an input/output device (I/O) 100. The memory circuit 104 may be formed as one or more memory modules, each containing one or more integrated memory devices (e.g., DRAM devices) including transistor devices constructed in accordance with the invention. Also, the CPU 102 may itself be an integrated processor which utilizes transistor devices constructed in accordance with the present invention, and both the CPU 102 and the memory circuit 104 may be integrated on a single chip.

The above description and accompanying drawings are only illustrative of exemplary embodiments, which can achieve the features and advantages of the present invention. It is not intended that the invention be limited to the embodiments shown and described in detail herein. The invention can be modified to incorporate any number of variations, alterations, substitutions or equivalent arrangements not heretofore described, but which are commensurate with the spirit and scope of the invention. The invention is only limited by the scope of the following claims.

What is claimed as new and desired to be protected by Letters Patent of the United States is:

1. A semiconductor device comprising:
    a substrate having at least two spaced doped source/drain regions, said source/drain regions defining a channel region therebetween; and
    a transistor gate over said substrate and between said spaced doped source/drain regions, said transistor gate having one first gate electrode of a first conductivity type and two second gate electrodes of a second conductivity type, where said two second gate electrodes are provided on either side of said first gate electrode, and are separated from said first gate electrode by an insulating dielectric layer.

2. The device of claim 1, further comprising a conductive cap layer, said conductive cap layer electrically connecting the first and second gate electrodes.

3. The device of claim 2, wherein said first gate electrode comprises a metal and has a workfunction higher than that of said second gate electrodes.

4. The device of claim 2, wherein said first gate electrode is of N+ conductivity type and said second gate electrodes are of P+ conductivity type, and said device is over an n-well of said substrate.

5. The device of claim 2, wherein the first gate electrode is of P+ conductivity type and the second gate electrodes are of N+ conductivity type.

6. The device of claim 5, wherein the first and second gate electrodes comprise doped polysilicon.

7. The device of claim 5, wherein the first gate electrode comprises silicon-germanium.

8. The device of claim 5, wherein the first and second gate electrodes comprise a material selected from the group consisting of silicon-carbide and silicon-oxycarbide.

9. The device of claim 5, wherein the dielectric layer comprises a material selected from the group consisting of nitride, oxynitride, and nitrided oxide.

10. The device of claim 5, wherein each of said second gate electrodes occupy about 10% to about 33% of the total channel region length between said source/drain regions.

11. The device of claim 9, wherein the dielectric layer is a nitride.

12. The device of claim 5, wherein the threshold voltages of said first and second gate electrodes are such that the portions of the channel region below said second gate electrodes are inverted first upon the application of a voltage to said conductive cap layer and the application of a greater voltage to said conductive cap layer is required to invert the portion of the channel region below said first gate electrode.

13. The device of claim 12, wherein said device is part of an apparatus included in the group consisting of memory devices, logic devices, processor devices, and ASIC devices.

14. The device of claim 12, wherein said device is used in a DRAM.

15. The device of claim 14, wherein said device is used as an access transistor of said DRAM.

16. The device of claim 14, wherein said DRAM is part of a memory module.

17. A semiconductor transistor having three gate electrodes, comprising:
    a semiconductor substrate having at least two spaced doped source/drain regions, said at least two spaced doped source/drain regions defining a channel region therebetween;
    a gate dielectric over said substrate;
    a central gate electrode containing a first dopant provided over said gate dielectric and said channel region; and
    two outer gate electrodes provided over said gate dielectric and said channel region and adjacent to said central gate electrode, said outer gate electrodes containing a second dopant having a different conductivity type than said first dopant and being separated from said central gate electrode by a dielectric layer;
    wherein a workfunction difference between the central gate electrode and the outer gate electrodes is such that said central gate electrode experiences a greater threshold voltage than said outer gate electrodes, said transistor being configured such that at least a portion of the channel region below said outer gate electrodes is converted to a virtual source/drain junction upon the application of a voltage to the outer gate electrodes.

18. The semiconductor transistor of claim 17, further comprising a conductive cap layer, said conductive cap layer electrically connecting the central and outer gate electrodes.

19. The semiconductor transistor of claim 18, wherein said central gate electrode comprises a metal and has a workfunction higher that that of said outer gate electrodes.

20. The semiconductor transistor of claim 18, wherein said central gate electrode is of N+ conductivity type and said outer gate electrodes are of P+ conductivity type, and said transistor is over an n-well of said substrate.

21. The semiconductor transistor of claim 18, wherein the central gate electrode is of a P+ conductivity type and the outer gate electrodes are of an N+ conductivity type.

22. The semiconductor transistor of claim 21, wherein the central and outer gate electrodes comprise doped polysilicon.

23. The semiconductor transistor of claim 21, wherein the central gate electrode comprises silicon-germanium.

24. The semiconductor transistor of claim 21, wherein each of said outer gate electrodes occupy about 10% to about 33% of the total channel region length between said source/drain regions.

25. The semiconductor transistor of claim 21, wherein said transistor is part of a memory device.

26. The semiconductor transistor of claim 21, wherein said transistor is part of a DRAM.

27. The semiconductor transistor of claim 21, wherein said device is part of an apparatus included in the group consisting of logic devices, processor devices, and ASIC devices.

28. The semiconductor transistor of claim 21, wherein the central and outer gate electrodes comprise a material selected from the group consisting of silicon-carbide and silicon-oxycarbide.

29. The semiconductor transistor of claim 28, wherein said DRAM is part of a memory module.

30. The semiconductor transistor of claim 21, wherein the dielectric layer comprises a material selected from the group consisting of nitride, oxynitride, and nitrided oxide.

31. The semiconductor transistor of claim 30, wherein the dielectric layer is a nitride.

32. A semiconductor device, comprising:
  a semiconductor substrate, said substrate having at least two separated doped source/drain regions;
  three gate electrodes over said substrate and at least partially between said source/drain regions, including a center gate electrode of P+ type conductivity and two adjacent outer gate electrodes of N+ type conductivity;
  a gate dielectric separating said three gate electrodes from said substrate;
  a thin dielectric layer separating said outer gate electrodes from said center gate electrode;
  a conductive cap layer over said three vertical gate electrodes, said conductive cap layer electrically connecting said three vertical gate electrodes; and
  insulating sidewalls adjacent to said conductive cap layer and said outer gate electrodes.

33. The semiconductor device of claim 32, wherein the three vertical gate electrodes comprise doped polysilicon.

34. The semiconductor device of claim 32, wherein the central gate electrode comprises silicon-germanium.

35. The semiconductor device of claim 32, wherein the three vertical gate electrodes comprise a material selected from the group consisting of silicon-carbide and silicon oxycarbide.

36. The semiconductor device of claim 32, wherein each of the outer gate electrodes occupy about 10% to about 33% of the total channel region length between said source/drain regions.

37. The semiconductor device of claim 32, wherein the dielectric layer comprises a material selected from the group consisting of nitride, oxynitride, and nitrided oxide.

38. The semiconductor device of claim 37, wherein the dielectric layer is a nitride.

39. The semiconductor device of claim 32, wherein a workfunction difference exists between the central gate electrode and the outer gate electrodes.

40. The semiconductor device of claim 39, wherein said workfunction difference results in the central gate electrode having a higher threshold voltage than said outer gate electrodes.

41. A transistor structure comprising:
  a semiconductor substrate having at least two spaced doped source/drain regions, said source/drain regions defining a channel region therebetween;
  a gate dielectric over said substrate;
  a central gate electrode over said channel region and said gate dielectric; and
  two outer gate electrodes over said channel region and said gate dielectric and adjacent to said central gate electrode, said outer gate electrodes being separated from said central gate electrode by a dielectric layer;
  wherein a workfunction difference between the central gate electrode and the outer gate electrodes is such that said central gate electrode experiences a greater threshold voltage than said outer gate electrodes, said transistor structure being configured such that at least a portion of the channel region of said substrate below said outer gate electrodes is converted to a virtual source/drain junction upon the application of a voltage to the outer gate electrodes.

42. The transistor structure of claim 41, further comprising a conductive cap layer, said conductive cap layer electrically connecting the central and outer gate electrodes.

43. The transistor structure of claim 42, wherein said central gate electrode comprises a metal and has a workfunction higher that that of said outer gate electrodes.

44. The transistor structure of claim 42, wherein said central gate electrode is of N+ conductivity type and said outer gate electrodes are of P+ conductivity type, and said transistor structure is over an n-well of said substrate.

45. The transistor structure of claim 42, wherein the central gate electrode is of a P+ conductivity type and the outer gate electrodes are of an N+ conductivity type.

46. The transistor structure of claim 45, wherein the central and outer gate electrodes comprise doped polysilicon.

47. The transistor structure of claim 45, wherein the central gate electrode comprises silicon-germanium.

48. The transistor structure of claim 45, wherein the central and outer gate electrodes comprise a material selected from the group consisting of silicon-carbide and silicon-oxycarbide.

49. The transistor structure of claim 45, wherein each of said outer gate electrodes occupy about 10% to about 33% of the total channel region length between said source/drain regions.

50. The transistor structure of claim 45, wherein the dielectric layer comprises a material selected from the group consisting of nitride, oxynitride, and nitrided oxide.

51. The transistor structure of claim 50, wherein the dielectric layer is a nitride.

52. A processor system comprising:

a processor;

a memory device coupled to said processor, at least one of the memory device and processor comprising a transistor;

said transistor comprising:

a substrate, said substrate having at least two separated doped source/drain regions, said source/drain regions defining a channel region;

a gate dielectric over the substrate;

a central gate electrode over said gate dielectric and said channel region, said central gate electrode being of a first conductivity type;

two side gate electrodes, said side gate electrodes being on either side of said central gate electrode and over said gate dielectric and said channel region, said side gate electrodes being of a second conductivity type;

a insulating dielectric layer separating said two side gate electrodes from said central gate electrode; and a conductive cap layer over the central gate electrode and the side gate electrodes, said conductive cap layer connecting said gate electrodes;

wherein said transistor is configured such that when a voltage is applied to the conductive cap layer the portions of said channel region under the side gate electrodes become inverted to form virtual source/drain extensions.

53. The processor system of claim 52, wherein said central gate electrode comprises a metal and has a higher workfunction than that of said side gate electrodes.

54. The processor system of claim 52, wherein said first conductivity type is N+ type and said second conductivity type is P+ type, and said transistor is over an n-well of said substrate.

55. The processor system of claim 52, where said first conductivity type is P+ type and said second conductivity type is N+ type.

56. The processor system of claim 52, wherein said central gate electrode and said side gate electrodes of said semiconductor transistor comprise doped polysilicon.

57. The processor system of claim 52, wherein said central gate electrode and said side gate electrodes comprise silicon-carbide.

58. The processor system of claim 52, wherein said central gate electrode and said side gate electrodes comprise silicon-oxycarbide.

59. The processor system of claim 52, wherein the central gate electrode of said semiconductor transistor comprises silicon-germanium.

60. The semiconductor transistor of claim 52, wherein each of the side gate electrodes of said semiconductor transistor occupy about 10% to about 33% of the total channel region length between said source/drain regions.

61. The processor system of claim 52, wherein said semiconductor transistor further comprises an insulating layer over said conductive cap layer, said central gate electrode, and said side gate electrodes.

62. The processor system of claim 52, wherein the insulating dielectric layer comprises a material selected from the group consisting of nitride, oxynitride, and nitrided oxide.

63. The processor system of claim 62, wherein the insulating dielectric layer is nitride.

* * * * *

UNITED STATES PATENT AND TRADEMARK OFFICE
CERTIFICATE OF CORRECTION

PATENT NO.     : 6,734,510 B2
DATED          : May 11, 2004
INVENTOR(S)    : Leonard Forbes et al.

It is certified that error appears in the above-identified patent and that said Letters Patent is hereby corrected as shown below:

Column 3,
Line 17, "conducing" should read -- conducting --.

Column 7,
Line 60, claim 1 should read:
    1. A semiconductor device comprising:

a substrate having at least two spaced doped source/drain regions, said source/drain regions defining a channel region therebetween; and a transistor gate over said substrate and wholly between said spaced doped source/drain regions, said transistor gate having one first gate electrode of a first conductivity type and two second gate electrodes of a second conductivity type, wherein said two second gate electrodes are provided on either side of said first gate electrode and are separated from said first gate electrode by an insulating dielectric layer.

Column 9,
Line 47, claim 32 should read:
    32. A semiconductor device, comprising:

a semiconductor substrate, said substrate having at least two separated doped source/drain regions;

three gate electrodes over said substrate and at least partially between said source/drain regions, including a center gate electrode of P+ type conductivity and two adjacent outer gate electrodes of N+ type conductivity;

a gate dielectric separating said three gate electrodes from said substrate;

a thin dielectric layer separating said outer gate electrodes from said center gate electrode;

a first conductive cap layer over said center gate electrode and a second conductive cap layer electrically connecting said outer gate electrodes; and

UNITED STATES PATENT AND TRADEMARK OFFICE
CERTIFICATE OF CORRECTION

PATENT NO.   : 6,734,510 B2
DATED        : May 11, 2004
INVENTOR(S)  : Leonard Forbes et al.

It is certified that error appears in the above-identified patent and that said Letters Patent is hereby corrected as shown below:

Column 9 (cont'd),
 insulating sidewalls adjacent to said conductive cap layer and said outer gate electrodes.

Signed and Sealed this

First Day of November, 2005

JON W. DUDAS
*Director of the United States Patent and Trademark Office*